(12) United States Patent
Lane et al.

(10) Patent No.: US 7,291,280 B2
(45) Date of Patent: Nov. 6, 2007

(54) MULTI-STEP METHODS FOR CHEMICAL MECHANICAL POLISHING SILICON DIOXIDE AND SILICON NITRIDE

(75) Inventors: Sarah J. Lane, Elkton, MD (US); Andrew Scott Lawing, Phoenix, AZ (US); Brian L. Mueller, Middletown, DE (US); Charles Yu, Wilmington, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 65 days.

(21) Appl. No.: 11/023,862

(22) Filed: Dec. 28, 2004

(65) Prior Publication Data

US 2006/0138086 A1    Jun. 29, 2006

(51) Int. Cl.
*H01L 21/302*    (2006.01)

(52) U.S. Cl. .................. 216/24; 438/16; 438/693; 356/181; 356/182; 451/6

(58) Field of Classification Search .............. 216/24
See application file for complete search history.

(56) References Cited

U.S. PATENT DOCUMENTS

| 5,391,258 | A | * | 2/1995 | Brancaleoni et al. | 216/89 |
| 6,019,806 | A | * | 2/2000 | Sees et al. | 51/308 |
| 6,293,845 | B1 | * | 9/2001 | Clark-Phelps | 451/5 |
| 6,307,628 | B1 | * | 10/2001 | Lu et al. | 356/124 |
| 6,593,240 | B1 | * | 7/2003 | Page | 438/692 |
| 6,910,951 | B2 | * | 6/2005 | Balijepalli et al. | 451/41 |
| 2002/0019202 | A1 | * | 2/2002 | Thomas et al. | 451/57 |
| 2003/0176151 | A1 | * | 9/2003 | Tam et al. | 451/41 |
| 2004/0055993 | A1 | * | 3/2004 | Moudgil et al. | 216/2 |
| 2004/0166779 | A1 | * | 8/2004 | Balijepalli et al. | 451/41 |
| 2005/0028450 | A1 | * | 2/2005 | Xu et al. | 51/309 |

FOREIGN PATENT DOCUMENTS

EP    1 479 741 A2    11/2004

OTHER PUBLICATIONS

Simpson; STI Planarization using Fixed Abrasive Technology; Feb. 2002; Future Fab International, vol. 12.*

* cited by examiner

*Primary Examiner*—Nadine Norton
*Assistant Examiner*—Patricia A. George
(74) *Attorney, Agent, or Firm*—Edwin Oh; Thomas S. Deibert (57) ABSTRACT

The present invention provides a method for polishing silica and silicon nitride on a semiconductor wafer comprising the steps of planarizing the silica with a first aqueous composition comprising by weight percent 0.01 to 5 carboxylic acid polymer, 0.02 to 6 abrasive, 0.01 to 10 polyvinylpyrrolidone, 0 to 5 cationic compound, 0 to 1 phthalic acid and salts, 0 to 5 zwitterionic compound and balance water, wherein the polyvinylpyrrolidone has an average molecular weight between 100 grams/mole to 1,000,000 grams/mole. The method further provides detecting an endpoint to the planarization, and clearing the silica with a second aqueous composition comprising by weight percent 0.001 to 1 quaternary ammonium compound, 0.001 to 1 phthalic acid and salts thereof, 0.01 to 5 carboxylic acid polymer, 0.01 to 5 abrasive and balance water.

10 Claims, 3 Drawing Sheets

MULTI-STEP METHODS FOR CHEMICAL MECHANICAL POLISHING SILICON DIOXIDE AND SILICON NITRIDE

BACKGROUND OF THE INVENTION

The invention relates to chemical mechanical planarization (CMP) of semiconductor wafer materials and, more particularly, to CMP methods for polishing silica and silicon nitride from semiconductor wafers in shallow trench isolation (STI) processes.

Decreasing dimensions of devices and the increasing density of integration in microelectronic circuits have required a corresponding reduction in the size of isolation structures. This reduction places a premium on reproducible formation of structures that provide effective isolation, while occupying a minimum amount of the substrate surface.

The STI technique is a widely used semiconductor fabrication method for forming isolation structures to electrically isolate the various active components formed in integrated circuits. One major advantage of using the STI technique over the conventional LOCOS (Local Oxidation of Silicon) technique is the high scalability to CMOS (Complementary Metal-Oxide Semiconductor) IC devices for fabrication at the submicron level of integration. Another advantage is that the STI technique helps prevent the occurrence of the so-called bird's beak encroachment, which is characteristic to the LOCOS technique for forming isolation structures.

In the STI technique, the first step is the formation of a plurality of trenches at predefined locations in the substrate, usually by anisotropic etching. Next, silica is deposited into each of these trenches. The silica is then polished by CMP, down to the silicon nitride (stop layer) to form the STI structure. To achieve efficient polishing, the polishing slurry typically provides a high selectivity involving the removal rate of silica relative to silicon nitride ("selectivity").

Figure 1A:
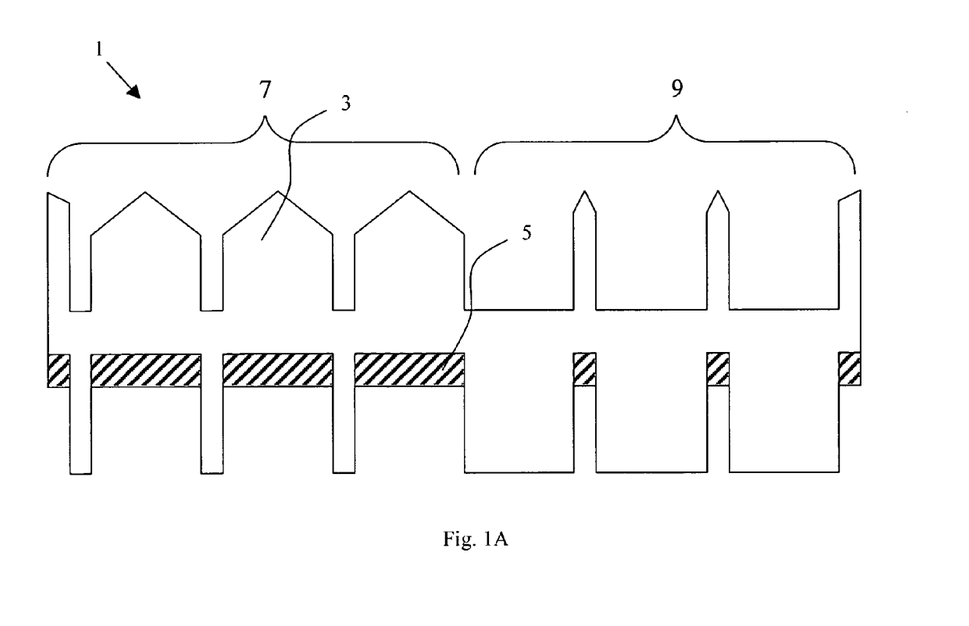
FIGS. 1A-1D illustrate the polished topography of silicon dioxide and silicon nitride utilizing a single step polishing process.
Figure 1B:
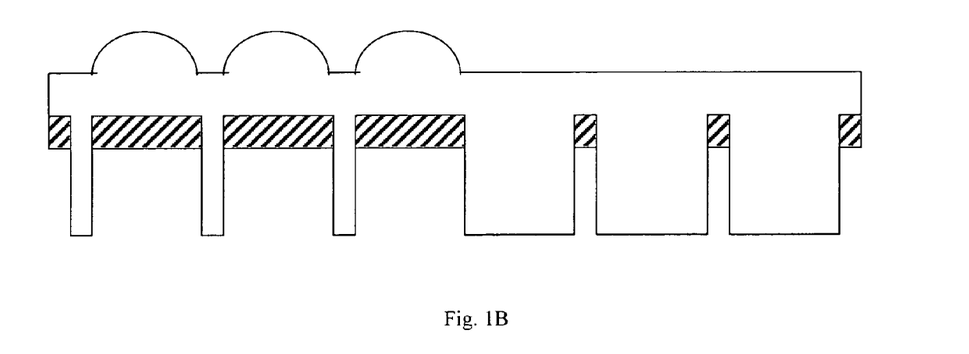
Figure 1C:
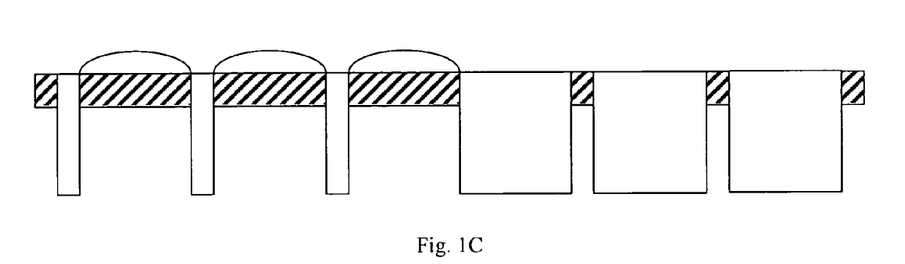
Figure 1D:
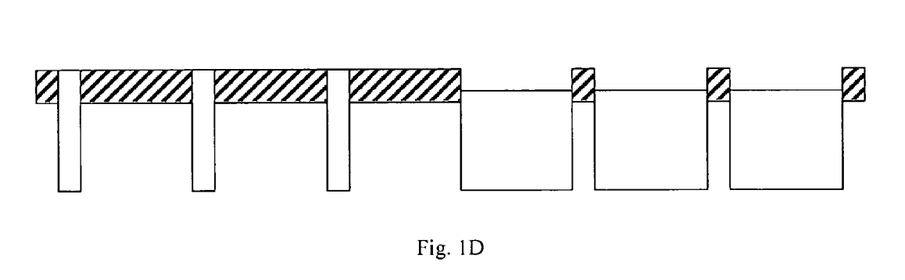

Unfortunately, highly selective slurries exhibit significant density dependence, causing die scale thickness variations. For example, as shown in FIGS. 1A-1D, a silicon substrate 1 is illustrated comprising a nitride layer 5 and an oxide layer 3. FIG. 1A illustrates the topography of the silicon substrate 1, pre-polishing, comprising "high" density regions 7 and "low" density regions 9. As the low density regions 9 are planarized, the high density regions 7 may still have a significant step height, as much as 3000 Å. Then, as the low density regions 9 are cleared, high density regions 7 may still have significant residual oxide 3, as much as 3000 Å. As a result, as the high density regions 7 are cleared, low density regions 9 may exhibit significant dishing, on the order of 500 Å or more.

Hattori et al., in EP 1479741A2, discloses a known method for polishing in STI processes. Although, the method of Hattori provides adequate selectivity, the ever-increasing density of integration in microelectronic circuits demand improved methods.

Hence, what is needed is a method for chemical-mechanical polishing of silicon dioxide ("silica") and silicon nitride for shallow trench isolation processes having improved dishing.

STATEMENT OF THE INVENTION

In a first aspect, the present invention provides a method for polishing silica and silicon nitride on a semiconductor wafer comprising the steps of: planarizing the silica with a first aqueous composition comprising by weight percent 0.01 to 5 carboxylic acid polymer, 0.02 to 6 abrasive, 0.01 to 10 polyvinylpyrrolidone, 0 to 5 cationic compound, 0 to 1 phthalic acid and salts, 0 to 5 zwitterionic compound and balance water, wherein the polyvinylpyrrolidone has an average molecular weight between 100 grams/mole to 1,000,000 grams/mole; detecting an endpoint to the planarization; and clearing the silica with a second aqueous composition comprising by weight percent 0.001 to 1 quaternary ammonium compound, 0.001 to 1 phthalic acid and salts thereof, 0.01 to 5 carboxylic acid polymer, 0.01 to 5 abrasive and balance water.

In a second aspect, the present invention provides a two step method for polishing silica and silicon nitride on a semiconductor wafer comprising the steps of: planarizing the silica with an inhibitive slurry; detecting a first endpoint and stopping the planarization; clearing the silica with a selective slurry; and detecting a second endpoint and stopping the clearing.

In a third aspect, the present invention provides a multi-step method for polishing silica and silicon nitride on a semiconductor wafer comprising: planarizing the silica with a first aqueous composition comprising by weight percent 0.01 to 5 carboxylic acid polymer, 0.02 to 6 abrasive, 0.01 to 10 polyvinylpyrrolidone, 0 to 5 cationic compound, 0 to 1 phthalic acid and salts, 0 to 5 zwitterionic compound and balance water, wherein the polyvinylpyrrolidone has an average molecular weight between 100 grams/mole to 1,000,000 grams/mole; detecting a first endpoint and stopping the planarization; clearing the silica with a second aqueous composition comprising by weight percent 0.001 to 1 quaternary ammonium compound, 0.001 to 1 phthalic acid and salts thereof, 0.01 to 5 carboxylic acid polymer, 0.01 to 5 abrasive and balance water; and detecting a second endpoint and stopping the clearing.

DETAILED DESCRIPTION OF THE INVENTION

A multi-step polishing method for planarization of STI structures has been developed. In the first step, a novel "stop-on-planar" or "inhibitive" slurry is used. This slurry exhibits a non-Prestonian response. The inhibitive slurry exhibits significantly faster polishing on an "up" area than a "down" area of an oxide film. The polish rate with this slurry preferably decreases as the step height of the oxide is reduced and planarization is achieved. In a preferred embodiment of the invention, an endpoint signal is used to trigger the end of the first step. Various methods, including, friction or motor current-based endpoint signals may be utilized. The point at which planarization is achieved can be determined based on characteristic features of the endpoint signal. By coupling the endpoint signal with the first step "inhibitive" slurry, the enhanced planarization characteristics can be maintained, while obtaining higher polish rates and significantly shorter process times as compared to operating in a true stop-on-planar mode.

At the end of the first step, the wafer is characterized by a substantially planar oxide overfill covering the entire wafer. In the second step, a novel, highly "selective" STI slurry is used to clear the overfill. This slurry exhibits a Prestonian response. The endpoint of the second step can also be determined through the use of a friction or motor current-based endpoint. Preferably, the wafer is already planarized (by the first step), and the higher pattern density dependence of the selective slurry does not compromise planarization performance. In addition, other endpointing systems (such as thermal or optical) that exhibit characteristic features corresponding to planarization can also be utilized.

Figure 2A:
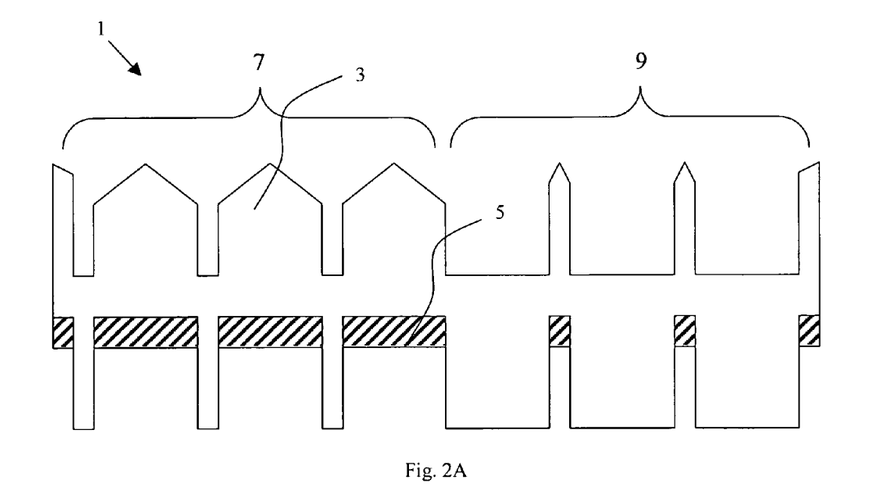
FIGS. 2A-2C illustrate the polished topography of silicon dioxide and silicon nitride utilizing a two step polishing process.
Figure 2B:
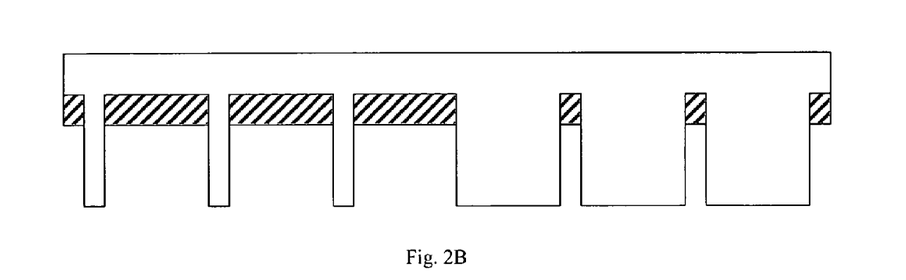
Figure 2C:
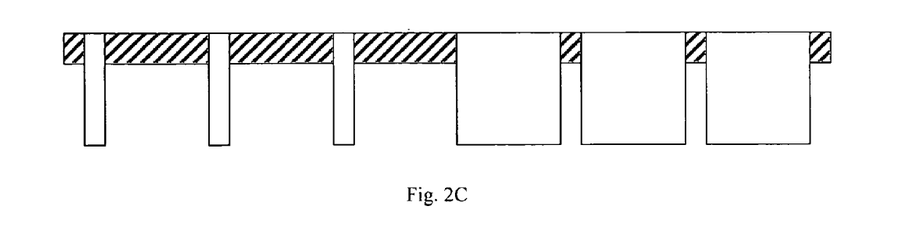

Referring now to FIGS. 2A-2C, a method of the present invention for polishing silicon dioxide and silicon nitride is illustrated, utilizing the first step polishing aqueous composition and the second step aqueous composition. FIG. 1A illustrates the pre-polished topography of the silicon substrate 1, including nitride layer 5 and an oxide layer 3, comprising "high" density regions 7 and "low" density regions 9. In a preferred embodiment of the invention, the high density regions 7 and low density regions 9 are planarized at similar rates at the end of the first step polish utilizing the first step polishing composition, as shown in FIG. 2B. Preferably, the endpoint or planarization of the first step polish may be determined utilizing, for example, frictional or optical endpoint signals. In addition, other endpointing systems (e.g., thermal or optical) that exhibit characteristic features corresponding to planarization can also be utilized. Then, as shown in FIG. 2C, the high density regions 7 and low density regions 9 are cleared at similar rates at the end of the second step polish utilizing the second step polishing composition of the present invention. Optionally, the endpoint or planarization of the first step polish may be determined utilizing, for example, frictional or optical endpoint signals.

Preferably, the novel first step polishing composition contains about 0.01 to 10 weight percent of polyvinylpyrrolidone to provide the pressure threshold response during oxide removal. Preferably, the polyvinylpyrrolidone is present in an amount of 0.015 to 5 weight percent. More preferably, the polyvinylpyrrolidone is present in an amount of 0.02 to 0.5 weight percent. In addition, blends of higher and lower number average molecular weight polyvinylpyrrolidone may be used.

Also, the weight average molecular weight of the polyvinylpyrrolidone is 100 to 1,000,000 grams/mole as determined by gel permeation chromatography (GPC). Preferably, the polyvinylpyrrolidone has a weight average molecular weight of 500 to 500,000 grams/mole. More preferably, the weight average molecular weight for the polyvinylpyrrolidone is about 1,500 to about 100,000 grams/mole.

In addition to the polyvinylpyrrolidone, the first step polishing composition preferably contains 0.01 to 5 weight percent of a carboxylic acid polymer to serve as a dispersant for the abrasive particles (discussed below). Preferably, the composition contains 0.05 to 1.5 weight percent of a carboxylic acid polymer. Also, the polymer preferably has a number average molecular weight of 4,000 to 1,500,000. In addition, blends of higher and lower number average molecular weight carboxylic acid polymers can be used. These carboxylic acid polymers generally are in solution but may be in an aqueous dispersion. The carboxylic acid polymer may advantageously serve as a dispersant for the abrasive particles (discussed below). The number average molecular weight of the aforementioned polymers are determined by GPC.

The carboxylic acid polymers are preferably formed from unsaturated monocarboxylic acids and unsaturated dicarboxylic acids. Typical unsaturated monocarboxylic acid monomers contain 3 to 6 carbon atoms and include acrylic acid, oligomeric acrylic acid, methacrylic acid, crotonic acid and vinyl acetic acid. Typical unsaturated dicarboxylic acids contain 4 to 8 carbon atoms and include the anhydrides thereof and are, for example, maleic acid, maleic anhydride, fumaric acid, glutaric acid, itaconic acid, itaconic anhydride, and cyclohexene dicarboxylic acid. In addition, water soluble salts of the aforementioned acids also can be used.

Particularly useful are "poly(meth)acrylic acids" having a number average molecular weight of about 1,000 to 1,500,000 preferably 3,000 to 250,000 and more preferably, 20,000 to 200,000. As used herein, the term "poly(meth) acrylic acid" is defined as polymers of acrylic acid, polymers of methacrylic acid or copolymers of acrylic acid and methacrylic acid. Blends of varying number average molecular weight poly(meth)acrylic acids are particularly preferred. In these blends or mixtures of poly(meth)acrylic acids, a lower number average molecular weight poly(meth) acrylic acid having a number average molecular weight of 1,000 to 100,000 and preferably, 4,000 to 40,000 is used in combination with a higher number average molecular weight poly(meth)acrylic acid having a number average molecular weight of 150,000 to 1,500,000, preferably, 200,000 to 300,000. Typically, the weight percent ratio of the lower number average molecular weight poly(meth)acrylic acid to the higher number average molecular weight poly (meth)acrylic acid is about 10:1 to 1:10, preferably 5:1 to 1:5, and more preferably, 3:1 to 2:3. A preferred blend comprises a poly(meth)acrylic acid having a number average molecular weight of about 20,000 and a poly(meth) acrylic acid having a number average molecular weight of about 200,000 in a 2:1 weight ratio.

In addition, carboxylic acid containing copolymers and terpolymers can be used in which the carboxylic acid component comprises 5-75% by weight of the polymer. Typical of such polymer are polymers of (meth)acrylic acid and acrylamide or methacrylamide; polymers of (meth) acrylic acid and styrene and other vinyl aromatic monomers; polymers of alkyl (meth)acrylates (esters of acrylic or methacrylic acid) and a mono or dicarboxylic acid, such as, acrylic or methacrylic acid or itaconic acid; polymers of substituted vinyl aromatic monomers having substituents, such as, halogen (i.e., chlorine, fluorine, bromine), nitro, cyano, alkoxy, haloalkyl, carboxy, amino, amino alkyl and a unsaturated mono or dicarboxylic acid and an alkyl (meth) acrylate; polymers of monethylenically unsaturated monomers containing a nitrogen ring, such as, vinyl pyridine, alkyl vinyl pyridine, vinyl butyrolactam, vinyl caprolactam, and an unsaturated mono or dicarboxylic acid; polymers of olefins, such as, propylene, isobutylene, or long chain alkyl olefins having 10 to 20 carbon atoms and an unsaturated mono or dicarboxylic acid; polymers of vinyl alcohol esters, such as, vinyl acetate and vinyl stearate or vinyl halides, such as, vinyl fluoride, vinyl chloride, vinylidene fluoride or vinyl nitriles, such as, acrylonitrile and methacrylonitrile and an unsaturated mono or dicarboxylic acid; polymers of alkyl (meth) acrylates having 1-24 carbon atoms in the alkyl group and an unsaturated monocarboxylic acid, such as, acrylic acid or methacrylic acid. These are only a few examples of the variety of polymers that can be used in the novel polishing composition of this invention. Also, it is possible to use polymers that are biodegradeable, photodegradeable or degradeable by other means. An example of such a composition that is biodegradeable is a polyacrylic acid polymer containing segments of poly(acrylate comethyl 2-cyanoacrylate).

Preferably, the first step polishing composition contains 0.2 to 6 weight percent abrasive to facilitate silica removal. Within this range, it is desirable to have the abrasive present in an amount of greater than or equal to 0.5 weight percent. Also, desirable within this range is an amount of less than or equal to 2.5 weight percent.

The abrasive has an average particle size of 50 to 200 nanometers (nm). For purposes of this specification, particle size refers to the average particle size of the abrasive. More preferably, it is desirable to use an abrasive having an average particle size of 80 to 150 nm. Decreasing the size of the abrasive to less than or equal to 80 nm, tends to improve the planarization of the polishing composition, but, it also tends to decrease the removal rate.

Example abrasives include inorganic oxides, inorganic hydroxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), or combinations comprising at least one of the foregoing oxides. Modified forms of these inorganic oxides, such as, polymer-coated inorganic oxide particles and inorganic coated particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Diamond may also be utilized as an abrasive if desired. Alternative abrasives also include polymeric particles and coated polymeric particles. The preferred abrasive is ceria.

The compounds provide efficacy over a broad pH range in solutions containing a balance of water. This solution's useful pH range extends from at least 4 to 9. In addition, the solution preferably relies upon a balance of deionized water to limit incidental impurities. The pH of the polishing fluid of this invention is preferably from 4.5 to 8, more preferably a pH of 5.5 to 7.5. The acids used to adjust the pH of the composition of this invention are, for example, nitric acid, sulfuric acid, hydrochloric acid, phosphoric acid and the like. Exemplary bases used to adjust the pH of the composition of this invention are, for example, ammonium hydroxide and potassium hydroxide.

Optionally, the first step polishing composition preferably contains 0 to 5 weight percent zwitterionic compound to promote planarization and serve as a suppressant to nitride removal. Preferably, the composition contains 0.01 to 1.5 weight percent zwitterionic compound. The zwitterionic compound of the present invention may advantageously promote planarization and may suppress nitride removal.

The term "zwitterionic compound" means a compound containing cationic and anionic substituents in approximately equal proportions joined by a physical bridge, for example, a $CH_2$ group, so that the compound is net neutral overall. The zwitterionic compounds of the present invention include the following structure:

wherein n is an integer, Y comprises hydrogen or an alkyl group, Z comprises carboxyl, sulfate or oxygen, M comprises nitrogen, phosphorus or a sulfur atom, and $X_1$, $X_2$ and $X_3$ independently comprise substituents selected from the group comprising, hydrogen, an alkyl group and an aryl group.

As defined herein, the term "alkyl" (or alkyl- or alk-) refers to a substituted or unsubstituted, straight, branched or cyclic hydrocarbon chain that preferably contains from 1 to 20 carbon atoms. Alkyl groups include, for example, methyl, ethyl, propyl, isopropyl, cyclopropyl, butyl, iso-butyl, tert-butyl, sec-butyl, cyclobutyl, pentyl, cyclopentyl, hexyl and cyclohexyl.

The term "aryl" refers to any substituted or unsubstituted aromatic carbocyclic group that preferably contains from 6 to 20 carbon atoms. An aryl group can be monocyclic or polycyclic. Aryl groups include, for example, phenyl, naphthyl, biphenyl benzyl, tolyl, xylyl, phenylethyl, benzoate, alkylbenzoate, aniline, and N-alkylanilino. Preferred zwitterionic compounds include, for example, betaines. A preferred betaine of the present invention is N,N,N-trimethylammonioacetate, represented by the following structure:

Optionally, the first step polishing composition of the present invention may comprise 0 to 5 weight percent cationic compound. Preferably, the composition optionally comprises 0.01 to 1.5 weight percent cationic compound. The cationic compound of the present invention may advantageously promote planarization, regulate wafer-clearing time and serve to suppress oxide removal. Preferred cationic compounds include, alkyl amines, aryl amines, quaternary ammonium compounds and alcohol amines. Exemplary cationic compounds include, methylamine, ethylamine, dimethylamine, diethylamine, trimethylamine, triethylamine, aniline, tetramethylammoniumhydroxide, tetraethylammoniumhydroxide, ethanolamine and propanolamine.

Optionally, the first step polishing composition preferably contains 0 to 1 weight percent complexing agent. Preferably, the composition contains 0.01 to 0.5 weight percent complexing agent. Example complexing agents include carbonyl compounds (e.g., acetylacetonates and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, phthalates, citrates, succinates, tartrates, malates, edetates (e.g., disodium EDTA), mixtures thereof, and the like), carboxylates containing one or more sulfonic and/or phosphonic groups. Also, other suitable complexing agents include, for example, di-, tri-, or poly-alcohols (e.g., ethylene glycol, pyrocatechol, pyrogallol, tannic acid, and the like) and phosphate-containing compounds (e.g., phospho- nium salts and phosphonic acids). Preferably, the complexing agent is phthalic acid and salts thereof. Preferred phthalate salts include, ammonium hydrogen phthalate and potassium hydrogen phthalate, and mixtures thereof.

Accordingly, the present invention provides a method of polishing utilizing a first step polishing composition useful for polishing silica and silicon nitride on a semiconductor wafer for shallow trench isolation processes. The composition preferably comprises polyvinylpyrrolidone for improved dishing performance. In particular, the present invention provides an aqueous composition useful for polishing silica and silicon nitride on a semiconductor wafer comprising by weight percent 0.01 to 5 carboxylic acid polymer, 0.02 to 6 abrasive, 0.01 to 10 polyvinylpyrrolidone, 0 to 5 cationic compound, 0 to 1 phthalic acid and salts, 0 to 5 zwitterionic compound and balance water, wherein the polyvinylpyrrolidone has a average molecular weight between 100 grams/mole to 1,000,000 grams/mole. The composition exhibits particularly improved threshold pressure response at a pH range of 4 to 9.

Preferably, as discussed in part above, an endpoint signal may be used to determine the end of the first step. Various methods, including, friction or motor current-based endpoint signals may be utilized. The point at which planarization is achieved can be resolved based on characteristic features of the endpoint signal. By coupling the endpoint signal with the first step "inhibitive" slurry, the enhanced planarization characteristics can be maintained, while obtaining higher polish rates and significantly shorter process times than when operating in a true stop-on-planar mode. Various endpoint detection systems (e.g., thermal and optical) can be utilized with the present multi-step STI polishing method. The end point signal for the first step is determined by utilizing the reduction in polishing and reaching planarity at the end of the first step. This end point signal for the second step is greatly enhanced as compared to the end point signal of a single step polishing method utilizing a conventional STI slurry. This end point (i.e., at the end of the first step) signal may be leveraged to optimized STI CMP performance (i.e., planarization and throughput).

Preferably, the novel second step polishing composition contains 0.001 to 1 weight percent quaternary ammonium compound to selectively remove the silica relative to the silicon nitride. More preferably, the composition contains 0.01 to 0.5 weight percent quaternary ammonium compound.

The quaternary ammonium compounds of the present invention include the following structure:

where $R_1$, $R_2$, $R_3$ and $R_4$ are an organic compound that has a carbon chain length of 1 to 15 carbon atoms. More preferably, $R_1$, $R_2$, $R_3$ and $R_4$ have a carbon chain length of 1 to 10. Most preferably, $R_1$, $R_2$, $R_3$ and $R_4$ have a carbon chain length of 1 to 5 carbon atoms. The organic compound of $R_1$, $R_2$, $R_3$ and $R_4$ may be a substituted or unsubstituted aryl, alkyl, aralkyl, or alkaryl group. Example anions include, nitrate, sulfate, halides (such as, bromide, chloride, fluoride and iodide), citrate, phosphate, oxalate, malate, gluconate, hydroxide, acetate, borate, lactate, thiocyanate, cyanate, sulfonate, silicate, per-halides (such as, perbromate, perchlorate and periodate), chromate, and mixtures comprising at least one of the foregoing anions.

Preferred quaternary ammonium compounds include, tetramethyl ammonium hydroxide, tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetratertbutyl ammonium hydroxide, tetrasecbutyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof. Most preferred quaternary ammonium compounds is tetramethyl ammonium hydroxide.

In addition to the quaternary ammonium compound, the second step polishing composition preferably contains 0.001 to 1 weight percent complexing agent. More preferably, the composition contains 0.01 to 0.5 weight percent complexing agent. Example complexing agents include carbonyl compounds (e.g., acetylacetonates and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, phthalates, citrates, succinates, tartrates, malates, edetates (e.g., disodium EDTA), mixtures thereof, and the like), carboxylates containing one or more sulfonic and/or phosphonic groups. Also, other suitable complexing agents include, for example, di-, tri-, or poly-alcohols (e.g., ethylene glycol, pyrocatechol, pyrogallol, tannic acid, and the like) and phosphate-containing compounds (e.g., phosphonium salts and phosphonic acids). Preferably, the complexing agent is phthalic acid and salts thereof. Preferred phthalate salts include, ammonium hydrogen phthalate and potassium hydrogen phthalate, and mixtures thereof.

Preferably, the novel second step polishing composition contains about 0.01 to 5 weight percent of a carboxylic acid polymer. Preferably, the composition contains about 0.05 to 3 weight percent of a carboxylic acid polymer. Also, the polymer preferably has a number average molecular weight of about 20,000 to 1,500,000. In addition, blends of higher and lower number average molecular weight carboxylic acid polymers can be used. These carboxylic acid polymers generally are in solution but may be in an aqueous dispersion. The number average molecular weight of the aforementioned polymers are determined by GPC (gel permeation chromatography).

The carboxylic acid polymers are formed from unsaturated monocarboxylic acids and unsaturated dicarboxylic acids. Typical unsaturated monocarboxylic acid monomers contain 3 to 6 carbon atoms and include acrylic acid, oligomeric acrylic acid, methacrylic acid, crotonic acid and vinyl acetic acid. Typical unsaturated dicarboxylic acids contain 4 to 8 carbon atoms and include the anhydrides thereof and are, for example, maleic acid, maleic anhydride, fumaric acid, glutaric acid, itaconic acid, itaconic anhydride, and cyclohexene dicarboxylic acid. In addition, water soluble salts of the aforementioned acids also can be used.

In addition, carboxylic acid containing copolymers and terpolymers can be used in which the carboxylic acid component comprises 5-75% by weight of the polymer. Typical of such polymer are polymers of (meth)acrylic acid and acrylamide or methacrylamide; polymers of (meth) acrylic acid and styrene and other vinyl aromatic monomers; polymers of alkyl (meth)acrylates (esters of acrylic or methacrylic acid) and a mono or dicarboxylic acid, such as, acrylic or methacrylic acid or itaconic acid; polymers of substituted vinyl aromatic monomers having substituents, such as, halogen, i.e., chlorine, fluorine, bromine, nitro, cyano, alkoxy, haloalkyl, carboxy, amino, amino alkyl and a unsaturated mono or dicarboxylic acid and an alkyl(meth) acrylate; polymers of monethylenically unsaturated monomers containing a nitrogen ring, such as, vinyl pyridine, alkyl vinyl pyridine, vinyl butyrolactam, vinyl caprolactam, and an unsaturated mono or dicarboxylic acid; polymers of olefins, such as, propylene, isobutylene, or long chain alkyl olefins having 10 to 20 carbon atoms and an unsaturated mono or dicarboxylic acid; polymers of vinyl alcohol esters, such as, vinyl acetate and vinyl stearate or vinyl halides, such as, vinyl fluoride, vinyl chloride, vinylidene fluoride or vinyl nitriles, such as, acrylonitrile and methacrylonitrile and an unsaturated mono or dicarboxylic acid; polymers of alkyl(meth)acrylates having 1-24 carbon atoms in the alkyl group and an unsaturated monocarboxylic acid, such as, acrylic acid or methacrylic acid. These are only a few examples of the variety of polymers that can be used in the novel polishing composition of this invention. Also, it is possible to use polymers that are biodegradeable, photodegradeable or degradeable by other means. An example of such a composition that is biodegradeable is a polyacrylic acid polymer containing segments of poly(acrylate comethyl 2-cyanoacrylate).

Preferably, the second step polishing composition contains 0.01 to 5 weight percent abrasive to facilitate silica removal. Within this range, it is desirable to have the abrasive present in an amount of greater than or equal to 0.1 weight percent. Also, desirable within this range is an amount of less than or equal to 3 weight percent.

The abrasive has an average particle size between 50 to 200 nanometers (nm). For purposes of this specification, particle size refers to the average particle size of the abrasive. More preferably, it is desirable to use an abrasive having an average particle size between 80 to 150 nm. Decreasing the size of the abrasive to less than or equal to 80 nm, tends to improve the planarization of the polishing composition, but, it also tends to decrease the removal rate.

Example abrasives include inorganic oxides, inorganic hydroxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), or combinations comprising at least one of the foregoing oxides. Modified forms of these inorganic oxides, such as, polymer-coated inorganic oxide particles and inorganic coated particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Diamond may also be utilized as an abrasive if desired. Alternative abrasives also include polymeric particles and coated polymeric particles. The preferred abrasive is ceria.

The second step polishing composition provides efficacy over a broad pH range in solutions containing a balance of water. This solution's useful pH range extends from at least 4 to 7. In addition, the solution preferably relies upon a balance of deionized water to limit incidental impurities. The pH of the polishing fluid of this invention is preferably from 4.5 to 6.8, more preferably a pH of 5 to 6.5. The acids used to adjust the pH of the composition of this invention are, for example, nitric acid, sulfuric acid, hydrochloric acid, phosphoric acid and the like. Exemplary bases used to adjust the pH of the composition of this invention are, for example, ammonium hydroxide and potassium hydroxide.

Accordingly, the present invention provides a method of polishing utilizing a second step polishing composition useful for polishing silica and silicon nitride on a semiconductor wafer for shallow trench isolation processes. The composition preferably comprises quaternary ammonium compounds for improved selectivity. In particular, the present invention provides an aqueous composition useful for polishing silica and silicon nitride on a semiconductor wafer comprising quaternary ammonium compound, phthalic acid and salts thereof, carboxylic acid polymer, abrasive and balance water. The composition exhibits particularly improved selectivity at a pH range of 4 to 7.

EXAMPLES

In the Examples, numerals represent examples of the invention and letters represent comparative examples. All first step aqueous solutions contained, by weight percent, 1.8 ceria, 0.27 polyacrylic acid, 0.5 betaine and 0.15 ethanolamine. In addition, the first step polishing composition contained 0.1 weight percent polyvinylpyrrolidone. All second step aqueous solutions contained, by weight percent, 1.8 ceria, 0.18 polyacrylic acid, 0.21 ammonium hydrogen phthalate and 0.12 tetramethyl ammonium hydroxide. The slurry was prepared by combining an abrasive package with a chemical package. The abrasive package was made by dissolving the polyacrylic acid concentrate in deionized water using a blade mixer and adding the ceria concentrate into the polyacrylic acid solution. Then, the ceria-polyacrylic acid-water mixture was titrated using nitric acid or ammonium hydroxide. The mixture was then fed into a high shear Kady Mill. The chemical package was prepared by dissolving all remaining chemicals into deionized water, in proper amounts, mixing with a blade mixer and titrating to the final pH as desired using nitric acid or ammonium hydroxide. The final slurry is prepared by mixing the abrasive package with the chemical package and titrating to the desired pH.

Example 1

This experiment measured the planarization performance of the two step polishing method compared to a single step process for trench oxide planarization. In particular, the effect of the two step polishing method on dishing in 10% to 90% trench oxide was tested. A 10% trench oxide is defined herein as the trenches in an array of repeated structures wherein the active width/(trench width+active width)×100%=10%. For example, if the trench width+active width=100 microns, the 10% trench has a width of 90 microns. Similarly, the 90% trench has a width of 10 microns. For the single step process, an Applied Materials Mirra 200 mm polishing machine using an IC1000™ polyurethane polishing pad (Rohm and Haas Electronic Materials CMP Inc.) under downforce conditions of 2.7 psi and a polishing solution flow rate of 85 cc/min, a platen speed of 123 RPM and a carrier speed of 44 RPM planarized the samples. For the first of the two step process, an Applied Materials Mirra 200 mm polishing machine using an IC1000™ polyurethane polishing pad (Rohm and Haas Electronic Materials CMP Inc.) under downforce conditions of 3.7 psi and a polishing solution flow rate of 125 cc/min, a platen speed of 51 RPM and a carrier speed of 68 RPM planarized the samples. The endpoint was determined utilizing a Luxtron Optima 9300 CMP Endpoint Controller.

The process conditions for the second of the two step process is the same as that of the single step process. The polishing solutions had a pH of 6.5 adjusted with nitric acid or ammonium hydroxide. All solutions contained a balance of deionized water.

TABLE 1

| Test | Site Feature (%) | Center Die Trench Oxide Thickness Range (Å) | Middle Die Trench Oxide Thickness Range (Å) | Edge Die Trench Oxide Thickness Range (Å) | Global Trench Oxide Thickness Range (Å) |
|---|---|---|---|---|---|
| A | 10-90 | 328 | 257 | 286 | 461 |
| 1 | 10-90 | 46 | 71 | 153 | 166 |

As illustrated in Table 1 above, the two step process (Test 1) provided significantly less dishing in low density features as compared to the single step process (Test A). Each of the trench oxide thickness ranges of the center, middle and edge die for the single step process provided a much greater range than that of the two step process. Namely, the trench oxide thickness ranges for the center, middle and edge die were 328 Å, 257 Å and 286 Å, respectively, for the single step process while the same thickness range measurements for the two step process provided 46 Å, 71 Å and 153 Å, respectively. In other words, the average trench within-die range for the two step polishing process was about 90 Å, as compared to about 290 Å for the single step process. Further, the global trench within-wafer range for the two step polishing process was about 166 Å, as compared to about 461 Å for the single step process.

Example 2

This experiment measured the planarization performance of the two step polishing method compared to a single step process nitride planarization. In particular, the effect of the two step polishing method on nitride loss in 10% to 100% site feature was tested. The process conditions were the same as that of Example 1.

TABLE 2

| Test | Site Feature (%) | Center Die Nitride Thickness Range (Å) | Middle Die Nitride Thickness Range (Å) | Edge Die Nitride Thickness Range (Å) | Global Nitride Thickness Range (Å) |
|---|---|---|---|---|---|
| B | 10-100 | 210 | 162 | 172 | 210 |
| 2 | 10-100 | 41 | 25 | 41 | 58 |

As illustrated in Table 2 above, the two step process (Test 2) provided significantly less nitride loss in low density features as compared to the single step process (Test B). Each of the nitride thickness ranges of the center, middle and edge die for the single step process provided a much greater range than that of the two step process. Namely, the nitride thickness ranges for the center, middle and edge die were 210 Å, 162 Å and 172 Å, respectively, for the single step process while the same thickness range measurements for the two step process provided 41 Å, 25 Å and 41 Å, respectively. In other words, the average trench within-die range for the two step polishing process was about 36 Å, as compared to about 181 Å for the single step process. Further, the global trench within-wafer range for the two step polishing process was about 58 Å, as compared to about 210 Å for the single step process.

Accordingly, the present invention provides a two step method for polishing silica and silicon nitride on a semiconductor wafer comprising the steps of planarizing the silica with an inhibitive slurry and detecting a first endpoint to stop the planarization. The method further provides clearing the silica with a selective slurry and detecting a second endpoint to stop the clearing.

What is claimed is:

1. A method for polishing silica on silicon nitride on a semiconductor wafer comprising the steps of:
   planarizing the silica with a first aqueous composition comprising by weight percent 0.01 to 5 carboxylic acid polymer, 0.02 to 6 abrasive, 0.01 to 10 polyvinylpyrrolidone, 0 to 5 cationic compound, 0 to 1 phthalic acid and salts, 0 to 5 zwitterionic compound and balance water, wherein the polyvinylpyrrolidone has an avenge molecular weight between 100 grams/mole to 1,000,000 grams/mole;
   detecting an endpoint to the planarization; and
   clearing the silica with a second aqueous composition comprising by weight percent 0.001 to 1 quaternary ammonium compound, 0.001 to 1 phthalic acid and salts thereof, 0.01 to 5 carboxylic acid polymer, 0.01 to 5 abrasive and balance water.

2. The method of claim 1 wherein the polyvinyipyrrolidone has a average molecular weight between 1,500 grams/mole to 10,000 grams/mole.

3. The method of claim 1 wherein the zwitterionic compound has the following structure:

wherein n is an integer, Y comprises hydrogen or an alkyl group, Z comprises carboxyl, sulfate or oxygen, M comprises nitrogen, phosphorus or a sulfur atom, and $X_1$, $X_2$ and $X_3$ independently comprise substituents selected from hydrogen, an alkyl group and an aryl group.

4. The method of claim 1 wherein the carboxylic acid polymer in the first and second aqueous compositions is a polyacrylic acid.

5. The method of claim 1 wherein the cationic compound is selected from alkyl amines, aryl amines, quaternary ammonium compounds and alcohol amines.

6. The method of claim 1 wherein the abrasive in the first and second aqueous compositions is ceria.

7. The method of claim 1 wherein the quaternary ammonium compound is selected from tetramethyl ammonium hydroxide, tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetratertbutyl ammonium hydroxide, tetrasecbutyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof.

8. The method of claim 1 wherein the phthalate salt is selected from ammonium hydrogen phthalate and potassium hydrogen phthalate.

9. A multi-step method for polishing silica on silicon nitride on a semiconductor wafer comprising the steps of:

planarizing the silica with an inhibitive slurry;
detecting a first endpoint and stopping the planarization;
clearing the silica with a selective slurry; and
detecting a second endpoint and stopping the clearing.

10. A multi-step method for polishing silica on silicon nitride on a semiconductor wafer comprising:

planarizing the silica with a first aqueous composition comprising by weight percent 0.01 to 5 carboxylic acid polymer, 0.02 to 6 abrasive, 0.01 to 10 polyvinylpyrrolidone, 0 to 5 cationic compound, 0 to 1 phthalic acid and salts, 0 to 5 zwitterionic compound and balance water, wherein the polyvinylpyrrolidone has an average molecular weight between 100 grams/mole to 1,000,000 grams/mole;

detecting a first endpoint and stopping the planarization;

clearing the silica with a second aqueous composition comprising by weight percent 0.001 to 1 quaternary ammonium compound, 0.001 to 1 phthalic acid and salts thereof, 0.01 to 5 carboxylic acid polymer, 0.01 to 5 abrasive and balance water; and detecting a second endpoint and stopping the clearing.

* * * * *